US009721798B2

(12) United States Patent
Shin et al.

(10) Patent No.: US 9,721,798 B2
(45) Date of Patent: Aug. 1, 2017

(54) METHOD AND APPARATUS FOR DEPOSITING AMORPHOUS SILICON FILM

(71) Applicant: EUGENE TECHNOLOGY CO., LTD., Yongin-si, Gyeonggi-do (KR)

(72) Inventors: Seung-Woo Shin, Hwaseong-si (KR); Hai-Won Kim, Icheon-si (KR); Woo-Duck Jung, Suwon-si (KR); Sung-Kil Cho, Yongin-si (KR); Wan-Suk Oh, Icheon-si (KR); Ho-Min Choi, Yongin-si (KR); Koon-Woo Lee, Yongin-si (KR)

(73) Assignee: EUGENE TECHNOLOGY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/915,705

(22) PCT Filed: Sep. 15, 2014

(86) PCT No.: PCT/KR2014/008571
§ 371 (c)(1),
(2) Date: Mar. 1, 2016

(87) PCT Pub. No.: WO2015/060541
PCT Pub. Date: Apr. 30, 2015

(65) Prior Publication Data
US 2016/0211141 A1    Jul. 21, 2016

(30) Foreign Application Priority Data

Oct. 21, 2013  (KR) .................. 10-2013-0125075

(51) Int. Cl.
*H01L 21/02*        (2006.01)
*H01L 31/18*        (2006.01)
(Continued)

(52) U.S. Cl.
CPC ........ *H01L 21/28556* (2013.01); *C23C 16/24* (2013.01); *C23C 16/4405* (2013.01);
(Continued)

(58) Field of Classification Search
CPC ............. C23C 16/24; H01L 21/023532; H01L 21/0262; H01L 21/02592; H01L 21/02532; H01L 21/0245; H01L 31/202
See application file for complete search history.

(56) References Cited

U.S. PATENT DOCUMENTS 5,576,819 A * 11/1996 Furusawa .......... G03G 15/1655
                                                        399/16
5,656,531 A *  8/1997 Thakur ............. H01L 21/32135
                                                      257/E21.013
(Continued)

FOREIGN PATENT DOCUMENTS

KR    10-2001-0111632 A    12/2001
KR    10-2008-0108067 A    12/2008
(Continued)

*Primary Examiner* — Marvin Payen
*Assistant Examiner* — Jeremy Joy
(74) *Attorney, Agent, or Firm* — Rabin & Berdo, P.C.

(57) ABSTRACT

Provided is a method and apparatus for depositing an amorphous silicon film. The method includes supplying a source gas and an atmospheric gas onto a substrate in a state where the substrate is loaded in a chamber to deposit the amorphous silicon film on the substrate. The atmospheric gas includes at least one of hydrogen and helium. The source gas includes at least one of silane ($SiH_2$), disilane ($Si_2H_6$), and dichlorosilane ($SiCl_2H_2$).

2 Claims, 4 Drawing Sheets

(51) Int. Cl.
*C23C 16/24* (2006.01)
*H01L 21/285* (2006.01)
*H01L 31/20* (2006.01)
*C23C 16/44* (2006.01)
*C23C 16/455* (2006.01)
*H01L 21/768* (2006.01)
*H01L 21/3205* (2006.01)

(52) U.S. Cl.
CPC .... *C23C 16/45563* (2013.01); *H01L 21/0245* (2013.01); *H01L 21/0262* (2013.01); *H01L 21/02532* (2013.01); *H01L 21/02592* (2013.01); *H01L 21/28525* (2013.01); *H01L 21/32055* (2013.01); *H01L 21/76877* (2013.01); *H01L 31/202* (2013.01)

(56) References Cited

U.S. PATENT DOCUMENTS

| | | | |
|---|---|---|---|
| 6,391,690 B2 * | 5/2002 | Miyasaka | C23C 16/0209 257/E21.101 |
| 6,436,488 B1 | 8/2002 | Theil et al. | |
| 6,459,482 B1 * | 10/2002 | Singh | H01J 37/28 250/252.1 |
| 2002/0037635 A1 * | 3/2002 | Li | C23C 16/24 438/482 |
| 2002/0090818 A1 * | 7/2002 | Thilderkvist | C23C 16/0236 438/689 |
| 2002/0173127 A1 * | 11/2002 | Wang | C23C 16/24 438/542 |
| 2008/0299747 A1 * | 12/2008 | Arai | C23C 16/24 438/485 |
| 2008/0311731 A1 | 12/2008 | Kim | |
| 2009/0023274 A1 * | 1/2009 | Cao | C23C 16/24 438/478 |
| 2009/0065816 A1 * | 3/2009 | Cunningham | C23C 16/24 257/255 |
| 2009/0315030 A1 * | 12/2009 | Choi | G06F 3/0412 257/53 |
| 2011/0088760 A1 * | 4/2011 | Sheng | H01L 21/0237 136/255 |
| 2015/0187560 A1 * | 7/2015 | Kim | H01L 21/0228 257/646 |

FOREIGN PATENT DOCUMENTS

| KR | 10-2008-0110094 A | 12/2008 |
|---|---|---|
| KR | 10-2008-0112736 A | 12/2008 |
| KR | 10-2011-0119581 A | 11/2011 |

* cited by examiner

METHOD AND APPARATUS FOR DEPOSITING AMORPHOUS SILICON FILM

BACKGROUND OF THE INVENTION

The present invention disclosed herein relates to a method and apparatus for forming an amorphous silicon film, and more particularly, to a method and apparatus for depositing an amorphous silicon film by using an atmospheric gas.

Amorphous silicon has been used to fill contact holes or lines in semiconductor integrated circuit apparatuses. Recently, as such a semiconductor integrated circuit apparatus is miniaturized, criteria for filling a contact hole or line are more and more tightened.

When the fine contact hole or line is filled with the amorphous silicon, the amorphous silicon may have a poor step coverage in the contact hole or cause a large void in the contact hole or line. When the large void is generated in the contact hole or line, the large void may be one of factors, for example, by which resistance increases. In addition, the large void may be a factor by which surface roughness is deteriorated in precision.

PRIOR ART DOCUMENT

Patent Document

Korean Patent Publication No. 10-2011-0119581 (Nov. 2, 2011)

SUMMARY OF THE INVENTION

The present invention provides a method and apparatus for depositing an amorphous silicon film, which are capable of improving precision of surface roughness.

The present invention also provides a method and apparatus for depositing an amorphous silicon film, which are capable of responding to miniaturization of a contact hole or line.

Further another object of the present invention will become evident with reference to following detailed descriptions and accompanying drawings.***.

Embodiments of the present invention provide methods for depositing an amorphous silicon film, the methods including: supplying a source gas and an atmospheric gas onto a substrate in a state where the substrate is loaded in a chamber to deposit the amorphous silicon film on the substrate, wherein the atmospheric gas includes at least one of hydrogen and helium.

In some embodiments, the source gas may include at least one of silane ($SiH_2$), disilane ($Si_2H_6$), and dichlorosilane ($SiCl_2H_2$).

In other embodiments, the source gas may have a flow rate of about 0.5 sccm to about 300 sccm, and the atmospheric gas may have a flow rate of about 100 sccm to about 25000 sccm.

In still other embodiments, the deposition process may be performed at a process pressure of about 1 Torr to about 300 Torr.

In even other embodiments, the deposition process may be performed at a process temperature of about 200° C. to about 800° C.

In other embodiments of the present invention, apparatuses for depositing an amorphous silicon film, the apparatuses including: a chamber providing an inner space in which a process with respect to a substrate is performed; a substrate support disposed within the chamber to support the substrate; first and second supply lines connected to an introduction unit disposed at one side of the chamber to respectively supply a source gas and an atmospheric gas into the chamber through the introduction unit; and first and second storage tank connected to the first and second supply lines to store the source gas and the atmospheric gas, respectively, wherein the atmospheric gas includes at lease one of hydrogen and helium.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
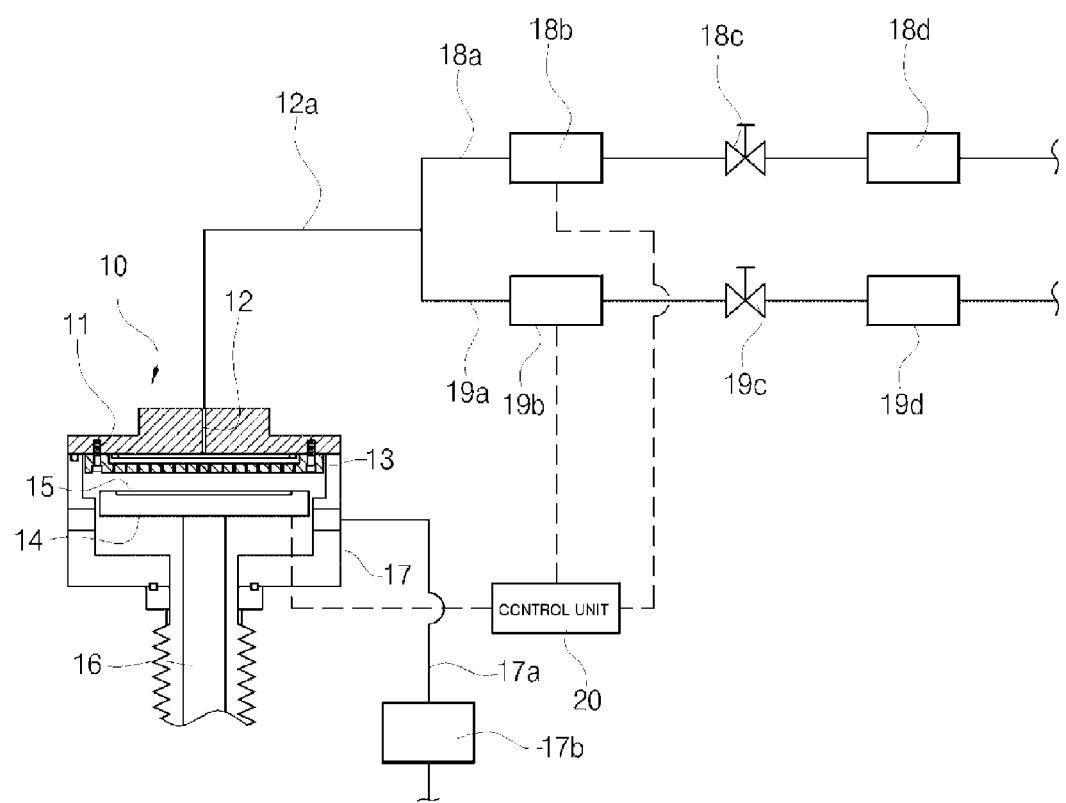
FIG. 1 is a schematic view of an apparatus for depositing an amorphous silicon film according to an embodiment of the present invention.

Hereinafter, exemplary embodiments of the present invention will be described in detail with reference to FIGS. 1 to 5. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the shapes of components are exaggerated for clarity of illustration.

Hereinafter, the term "amorphous silicon" does not merely represent only the amorphous silicon. For example, the amorphous silicon includes amorphous silicon, nanocrystalline silicon formed by combining crystal grains each of which has an amorphous nano size to achieve precision in surface roughness that will be described below, and silicon in which the amorphous silicon is mixed with the nanocrystalline silicon.

FIG. 1 is a schematic view of an apparatus for depositing an amorphous silicon film according to an embodiment of the present invention. In general, chemical vapor deposition is a process in which a gaseous source gas is supplied onto a semiconductor substrate to induce chemical reaction with the substrate, thereby forming a thin film on the substrate.

Referring to FIG. 1, a chamber 11 provides an inner space sealed from the outside. An introduction unit 12 for introducing a source gas into the inner space is provided in an upper portion of the chamber 11. A main supply line 12a and first and second supply lines 18a and 19a connected to the main supply line 12a may be connected to the introduction unit 12. The source gas may be supplied into the chamber 11 through the first supply line 18a, and an atmospheric gas may be supplied into the chamber 11 through the second supply line 19a. The source gas may be a silane-based gas such as silane ($SiH_2$), disilane ($Si_2H_6$), and dichlorosilane ($SiCl_2H_2$, DCS). The atmospheric gas may be at least one of hydrogen (H) and helium (He). The source gas may be stored in a first storage tank 18d connected to the first supply line 18a, and the atmospheric gas may be stored in a second storage tank 19d connected to the second supply line 19a.

Also, a first flow controller 18b and a first valve 18c are disposed in the first supply line 18a, and a second flow controller 19b and a second valve 19c are disposed in the second supply line 19a. Here, the gas introduced through the introduction unit 12 may be injected into the chamber 11 through a showerhead 13 disposed in the chamber 11.

Also, a wafer 15 that is a target object to be deposited may be placed on a heater 14. The heater 14 may heat the wafer 15 to a process temperature in a state where the heater 14 is supported by a heater support 16. When the deposition is completed, a non-reaction gas and by-products within the chamber 11 may be exhausted through a vacuum port 17. An exhaust line 17a and a vacuum pump 17b may be connected to the vacuum port 17 to forcibly exhaust the non-reaction gas and the by-products within the chamber 11. Also, a process pressure within the chamber 11 may be adjusted by using the exhaust line 17a and the vacuum pump 17b.

According to the above-described method, the source gas and the atmospheric gas may be supplied onto the wafer 15 within the chamber 11. Then, an amorphous silicon film may be deposited on the wafer 15 using a source gas pyrolyzed by the heater 14. Here, a control unit 20 may control the heater 14 for adjusting the process temperature, the vacuum pump 17b for adjusting the process pressure, and the first and second flow controllers 18b and 19b for respectively adjusting supply flow rates of the source gas and the atmospheric gas. The controller 20 may adjust the process temperature in the chamber 11 to a temperature of about 200° C. to about 800° C. and the process pressure in the chamber 11 to a pressure of about 1 Torr to about 200 Torr. Also, the control unit 20 may adjust the supply flow rate of the source gas to a flow rate of about 0.5 sccm to about 300 sccm and the supply flow rate of the atmospheric gas to a flow rate of about 100 sccm to about 25,000 sccm.

As described above, the wafer 15 may be loaded into the chamber 11, and then the source gas and the atmospheric gas may be supplied onto the wafer 15 at nearly the same time to deposit the amorphous silicon film on the wafer 15. The source gas may be a silane-based gas such as a silane ($SiH_2$), disilane ($Si_2H_6$), and dichlorosilane ($SiCl_2H_2$, DCS). Also, the wafer 15 may be loaded into the chamber 11 in a state where a seed layer is formed on a top surface of the wafer 15. Here, the amorphous silicon film may be formed on the seed layer.

Figure 2:
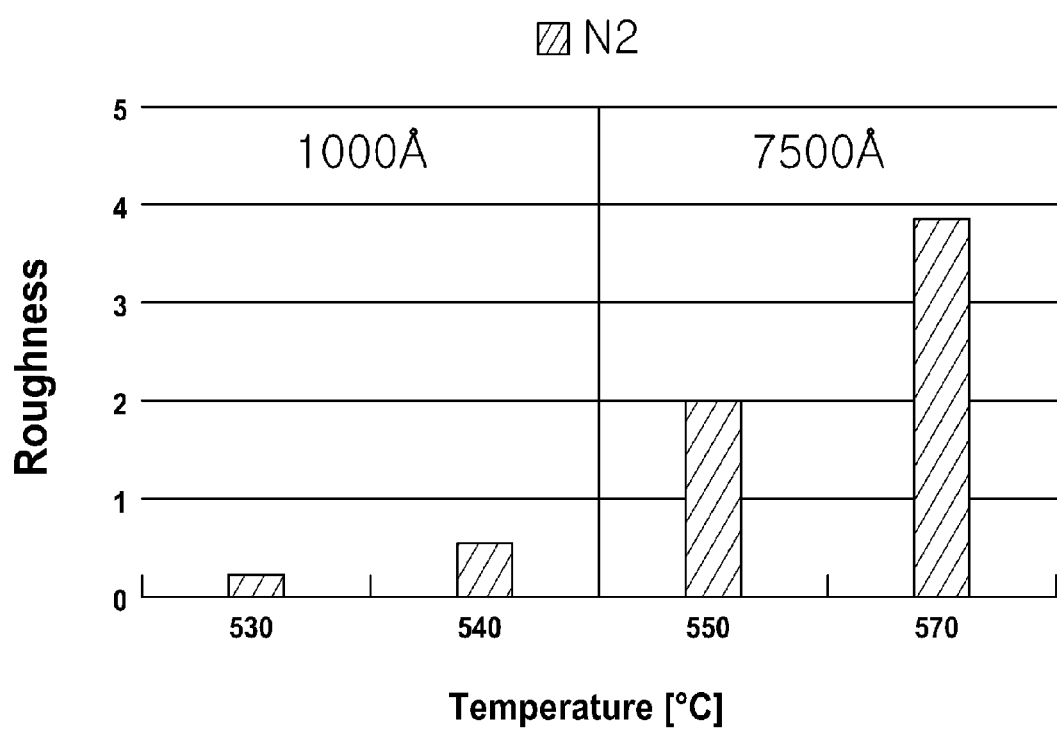
FIG. 2 is a graph illustrating a variation in surface roughness according to a temperature when the amorphous silicon film is deposited using a nitrogen gas as an atmospheric gas.
Figure 3:
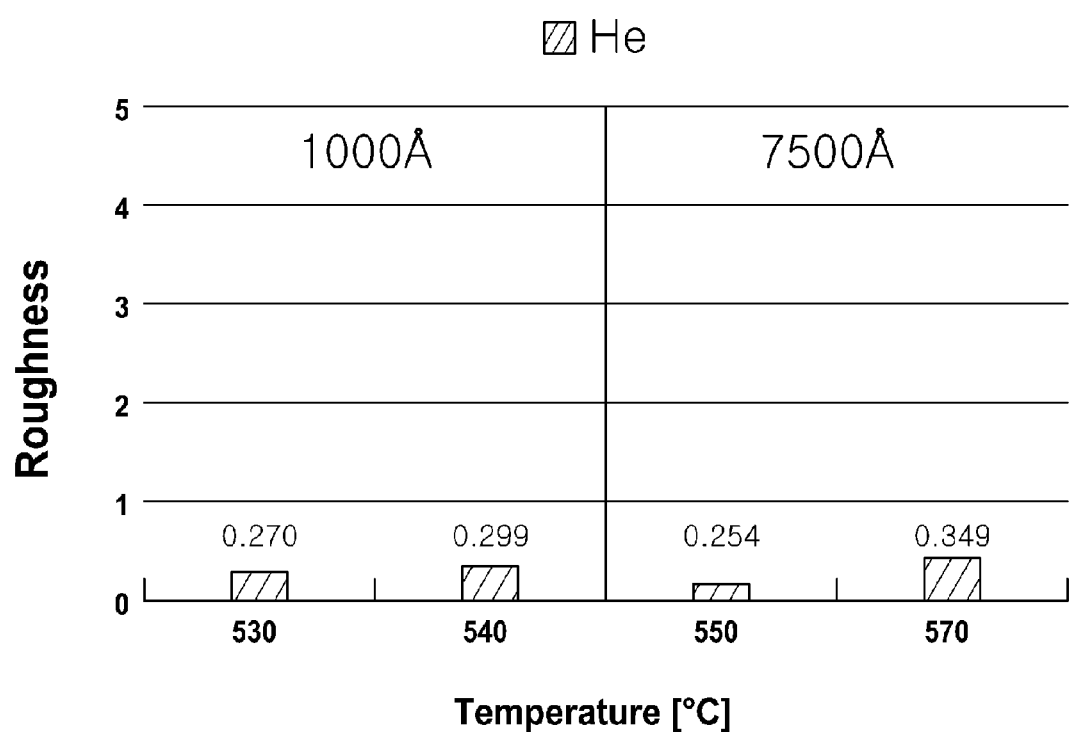
FIG. 3 is a graph illustrating a variation in surface roughness according to a temperature when the amorphous silicon film is deposited using a helium gas as an atmospheric gas.

FIG. 2 is a graph illustrating a variation in surface roughness according to a temperature when the amorphous silicon film is deposited using a nitrogen gas as an atmospheric gas. That is, FIG. 2 shows surface roughness of each of the amorphous silicon films when an amorphous silicon film is deposited to a thickness of about 1000 Å at temperatures of about 530° C. and about 540° C., and when an amorphous silicon film is deposited to a thickness of about 7500 Å at temperatures of about 550° C. and about 570° C. (process pressure: 2 Torr, and the source gas is disilane ($Si_2H_6$)). FIG. 3 is a graph illustrating a variation in surface roughness according to a temperature when the amorphous silicon film is deposited using a helium gas as an atmospheric gas. That is, FIG. 3 shows surface roughness of each of the amorphous silicon films when an amorphous silicon film is deposited to a thickness of about 1000 Å at temperatures of about 530° C. and about 540° C., and when an amorphous silicon film is deposited to a thickness of about 7500 Å at temperatures of about 550° C. and about 570° C.

Referring to FIG. 2, it was seen that, if a nitrogen gas is used as the atmospheric gas, when the amorphous silicon film has a thickness of about 1,000 Å, the amorphous silicon film has surface roughness of about 1 nm or less, however, when the amorphous silicon film has a thickness of about 7500 Å, the amorphous silicon film has surface roughness of about 2 nm or more. That is, as the amorphous silicon film increases in thickness, the surface roughness thereof may rapidly increase. On the other hand, referring to FIG. 3, it was seen that, if a helium gas is used as the atmospheric gas, when the amorphous silicon film has a thickness of about 1000 Å, the amorphous silicon film has surface roughness of about 1 nm or less, and, when the amorphous silicon film has a thickness of about 7500 Å, the amorphous silicon film has surface roughness of about 1 nm or less. That is, in spite of that the amorphous silicon film increases in thickness, the surface roughness thereof may be maintained at the same level.

In general, in a batch type deposition apparatus, the thin film has an improved surface roughness when compared to that in a single type deposition apparatus illustrated in FIG. 1. Here, the surface roughness gradually increases as a thin film increases in thickness. However, as illustrated in FIG. 3, when the helium gas is used as the atmospheric gas, the amorphous silicon film has the same surface roughness regardless of the thickness of the thin film. In particular, when the amorphous silicon film has a thickness of about 7500 Å, the surface roughness of the amorphous silicon film may be the same level as that of the amorphous silicon film in the batch type deposition apparatus.

Figure 4:
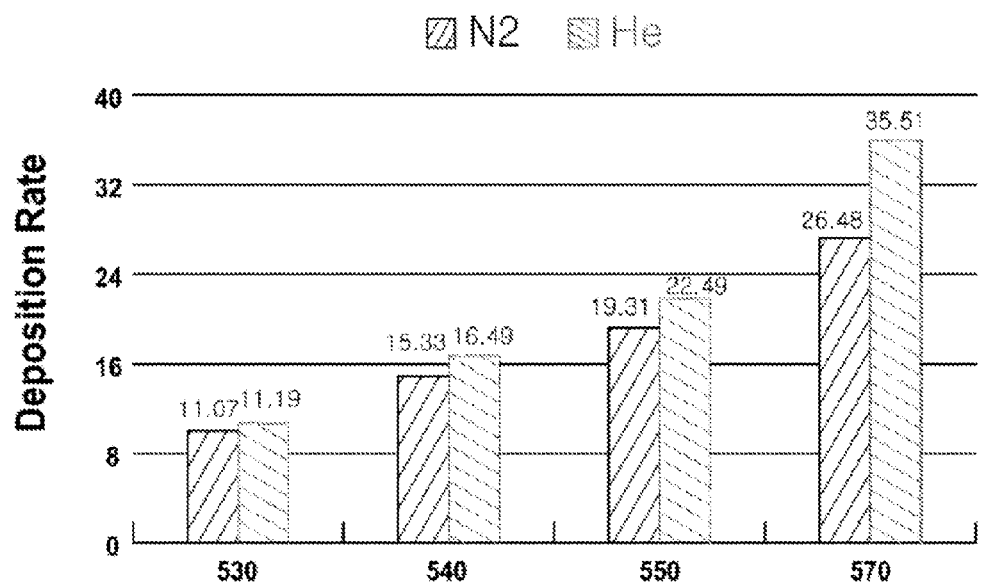
FIG. 4 is a graph illustrating results obtained by comparing deposition rates of the amorphous silicon films according to a deposition temperature when the nitrogen gas and the helium gas are used as the atmospheric gas.

FIG. 4 is a graph illustrating results obtained by comparing deposition rates of the amorphous silicon films according to a deposition temperature when the nitrogen gas and the helium gas are used as the atmospheric gas. Referring to FIG. 4, it was seen that, when a deposition temperature is about 530° C., a deposition rate is about 11.07 (the atmospheric gas: the nitrogen gas) which is little different from that of about 11.19 (the atmospheric gas: the helium gas). However, as the deposition temperature increases, a difference between the deposition rates gradually increases. When the deposition temperature is about 570° C., the deposition rate is about 26.48 (the atmospheric gas: the nitrogen gas) which is different by about 30% or more from the deposition rate of about 35.51 (the atmospheric gas: the helium gas).

Resultantly, if the helium gas is used as the atmospheric gas, when the thin film increases in thickness (for example, a thickness of about 7500 Å), the increase of the surface roughness may be prevented. Also, the amorphous silicon film in the single type deposition apparatus may have the same surface roughness as that in the batch type deposition apparatus. In particular, the deposition rate at a high temperature (for example, a temperature of about 540° C. or more) may be significantly improved.

Figure 5:
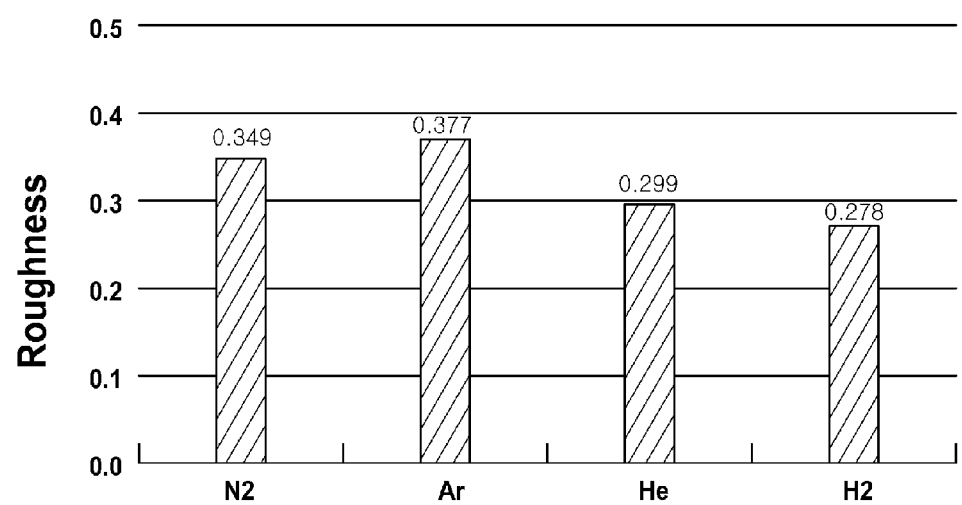
FIG. 5 is a graph illustrating surface roughness of the amorphous film according to the atmospheric gases.

FIG. 5 is a graph illustrating surface roughness of the amorphous film according to the atmospheric gases. An amorphous silicon film was deposited under conditions shown in following Table 1 by using nitrogen (N), argon (Ar), helium (He), and hydrogen (H) as an atmospheric gas and using disilane ($Si_2H_6$) as a source gas.

TABLE 1

| Atmospheric gas | Process temperature (° C.) | Disilane (sccm) | Atmospheric gas (sccm) | Pressure | Deposition rate (Å/sec) | Thickness (Å) |
| --- | --- | --- | --- | --- | --- | --- |
| Nitrogen (N) | 530 | 30 | 20000 | 30 | 0.7 | 50 |
| Argon (Ar) | | | 18000 | | 0.79 | |
| Helium (He) | | | 12000 | | 0.72 | |
| Hydrogen (H) | | | 8000 | | 0.76 | |

As a result, it was seen that, when helium (He) is supplied, the surface roughness of the amorphous silicon film was improved in comparison to that of the amorphous silicon film when nitrogen (N) and argon (Ar) are supplied. That is, when each of nitrogen (N) and argon (Ar) are supplied onto the amorphous silicon film, a surface roughness of the amorphous silicon film is greater than about 0.3 nm. However, when helium (He) is supplied, a surface roughness of the amorphous silicon film is less than about 0.3 nm. That is, it was seen that, when helium (He) is supplied, the amorphous silicon film has surface roughness improved by about 15% or more. Also, when hydrogen (H) is supplied, a surface roughness of the amorphous silicon film was improved in comparison to that when helium (He) is supplied. Also, when hydrogen (H) is supplied, the amorphous silicon film has a deposition rate of about 0.76 Å/sec which is greater than that of about 0.72 Å/sec when helium (He) is supplied.

The above-described amorphous silicon film is useful to fill a contact hole defined in an interlayer dielectric such as a silicon oxide film or a silicon nitride film or to fill a line defined in the interlayer dielectric, e.g., a groove for an inner wire. Particularly, if the amorphous silicon film has great surface roughness, a large void may be generated when the contact hole is filled with the amorphous silicon film. On the other hand, if the amorphous silicon film has low surface roughness, a small void may be generated to prevent a resistance of the amorphous silicon film filled in the contact hole from increasing.

According to the embodiments of the present invention, the surface roughness may be more improved in precision. Also, the method and apparatus according to the present invention may respond to the miniaturization of the contact hole or line.

Although the present invention is described in detail with reference to the exemplary embodiments, the invention may be embodied in many different forms. Thus, technical idea and scope of claims set forth below are not limited to the preferred embodiments.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus for depositing an amorphous silicon film, the apparatus comprising:
    a chamber providing an inner space in which a process with respect to a substrate is performed at a process temperature under a process pressure;
    a vacuum port through which a non-reaction gas and by-products in the inner space are exhausted;
    a substrate support disposed within the chamber to support the substrate;
    first and second supply lines connected to an introduction unit disposed at one side of the chamber to respectively supply a source gas and an atmospheric gas into the chamber through the introduction unit;
    first and second storage tank connected to the first and second supply lines to store the source gas and the atmospheric gas, respectively, the source gas comprising at least one of silane ($SiH_2$), disilane ($Si_2H_6$), and dichlorosilane ($SiCl_2H_2$);
    an exhaust line connected to the vacuum port;
    a vacuum pump exhausting forcibly the non-reaction gas and the by-product in the inner space;
    a control unit controlling the substrate support to adjust the process temperature in a range of about 540° C. to about 580° C., and further controlling the vacuum pump to adjust the process pressure in a range of about 8 Torr to about 300 Torr in the inner space, so that the source gas is pyrolyzed to deposit the amorphous silicon film on the substrate; and
    first and second flow controllers disposed in the first and second supply lines, respectively, for respectively adjusting supply flow rates of the source gas and the atmosphere gas,
    wherein the atmospheric gas comprises at least one of hydrogen and helium.

2. The apparatus of claim 1, wherein the control unit controls the first flow controller to adjust the supply flow rate of the source gas to a flow rate of about 0.5 sccm to about 300 sccm and the second flow controller to adjust the supply flow rate of the atmospheric gas to a flow rate of about 100 sccm to about 25,000 sccm.

* * * * *